United States Patent
Panagopoulos et al.

(10) Patent No.: US 10,153,282 B1
(45) Date of Patent: Dec. 11, 2018

(54) ULTRA-HIGH VACUUM TRANSPORT AND STORAGE

(71) Applicant: Lam Research Corporation, Fremont, CA (US)

(72) Inventors: Theodoros Panagopoulos, Los Gatos, CA (US); Richard Gould, Fremont, CA (US); Edmundo Reyes, Fremont, CA (US); John Boniface, San Jose, CA (US); Ivan Berry, Green Valley, AZ (US); Alexander Dulkin, Sunnyvale, CA (US); Bart van Schravendijk, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/674,883

(22) Filed: Aug. 11, 2017

(51) Int. Cl.
| | | |
|---|---|---|
| *H01L 21/673* | (2006.01) | |
| *H01L 27/108* | (2006.01) | |
| *H01L 21/677* | (2006.01) | |

(52) U.S. Cl.
CPC ...... *H01L 27/108* (2013.01); *H01L 21/67393* (2013.01); *H01L 21/67703* (2013.01)

(58) Field of Classification Search
CPC ............... H01L 21/673; H01L 21/6735; H01L 21/67389; H01L 21/67393; H01L 21/677; H01L 21/67703
USPC ............................................. 414/217.1, 220
See application file for complete search history.

(56) References Cited

U.S. PATENT DOCUMENTS

| | | | |
|---|---|---|---|
| 6,071,059 A | 6/2000 | Mages et al. | |
| 6,120,229 A | 9/2000 | Hofmeister | |
| 8,328,495 B2 | 12/2012 | Bufano et al. | |
| 9,105,673 B2 | 8/2015 | Babbs et al. | |
| 9,176,397 B2* | 11/2015 | Kuiper | G03F 7/7075 |
| 9,575,418 B2* | 2/2017 | Kuiper | G03F 7/7075 |
| 2006/0088272 A1 | 4/2006 | Gilchrist et al. | |
| 2009/0196714 A1* | 8/2009 | Sylvestre | H01L 21/67383 414/217.1 |
| 2014/0202921 A1* | 7/2014 | Babbs | H01L 21/67775 206/710 |
| 2016/0126128 A1* | 5/2016 | Bonora | H01L 21/68707 414/222.02 |
| 2018/0141762 A1* | 5/2018 | Caveney | H01L 21/67173 |

OTHER PUBLICATIONS

"Operating Instructions CapaciTorr HV 200 Pump" SAES Advanced Technologies S.p.A—Italy, M.Hist.0095.23 Rev. 1, Sep. 30, 2015

* cited by examiner

Primary Examiner — Kaitlin S Joerger
(74) Attorney, Agent, or Firm — Beyer Law Group LLP

(57) ABSTRACT

An apparatus for transporting or storing at least one semiconductor wafer in an ultra-high vacuum is provided. A portable vacuum transfer pod is provided comprising an internal wafer storage chamber for storing one or more wafers and a wafer support for supporting at least one wafer within the internal wafer storage chamber. A passively capable vacuum pump capable of passive vacuum pumping is in fluid connection with the internal wafer storage chamber and is mechanically connected to the portable vacuum transfer pod. A shut off valve for opening and closing the fluid connection is between the passively capable vacuum pump and the internal wafer storage chamber.

17 Claims, 4 Drawing Sheets

ULTRA-HIGH VACUUM TRANSPORT AND STORAGE

BACKGROUND

Field

The disclosure relates to semiconductor devices. More specifically, the disclosure relates to the production of semiconductor devices in a process that requires storage or transportation of wafers outside of a processing system for a period of time.

Description of Related Art

Integrated processing (processing wafers within a limited wait/idle time and under high vacuum conditions) has been recognized as an important requirement for successfully developing magnetoresistive random access memory ("MRAM") and phase change memories ("PCM").

SUMMARY

To achieve the foregoing and in accordance with the purpose of the present disclosure, an apparatus for transporting or storing at least one semiconductor wafer in a vacuum is provided. A portable vacuum transfer pod is provided comprising an internal wafer storage chamber for storing one or more wafers and a wafer support for supporting at least one wafer within the internal wafer storage chamber. A passively capable vacuum pump capable of passive vacuum pumping is in fluid connection with the internal wafer storage chamber and is mechanically connected to the portable vacuum transfer pod. A shut off valve for opening and closing the fluid connection is between the passively capable vacuum pump and the internal wafer storage chamber.

In another manifestation, a method for transporting a wafer from a first wafer processing device to a second wafer processing device is provided. A portable vacuum transfer pod is docked to a first docking station. Pressure in the portable vacuum transfer pod is pumped down. At least one wafer is transferred through the first docking station to the portable vacuum transfer pod. The portable vacuum transfer pod is sealed and removed from the first docking station. A passively capable vacuum pump is used to passively maintain pressure in the portable vacuum transfer pod at a pressure less than $1\times10^{-3}$ Torr. The portable vacuum transfer pod is moved to a second docking station. The portable vacuum transfer pod is docked to the second docking station. The at least one wafer is transferred from the portable vacuum transfer pod through the second docking station.

These and other features of the present disclosure will be described in more details below in the detailed description of the disclosure and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1:
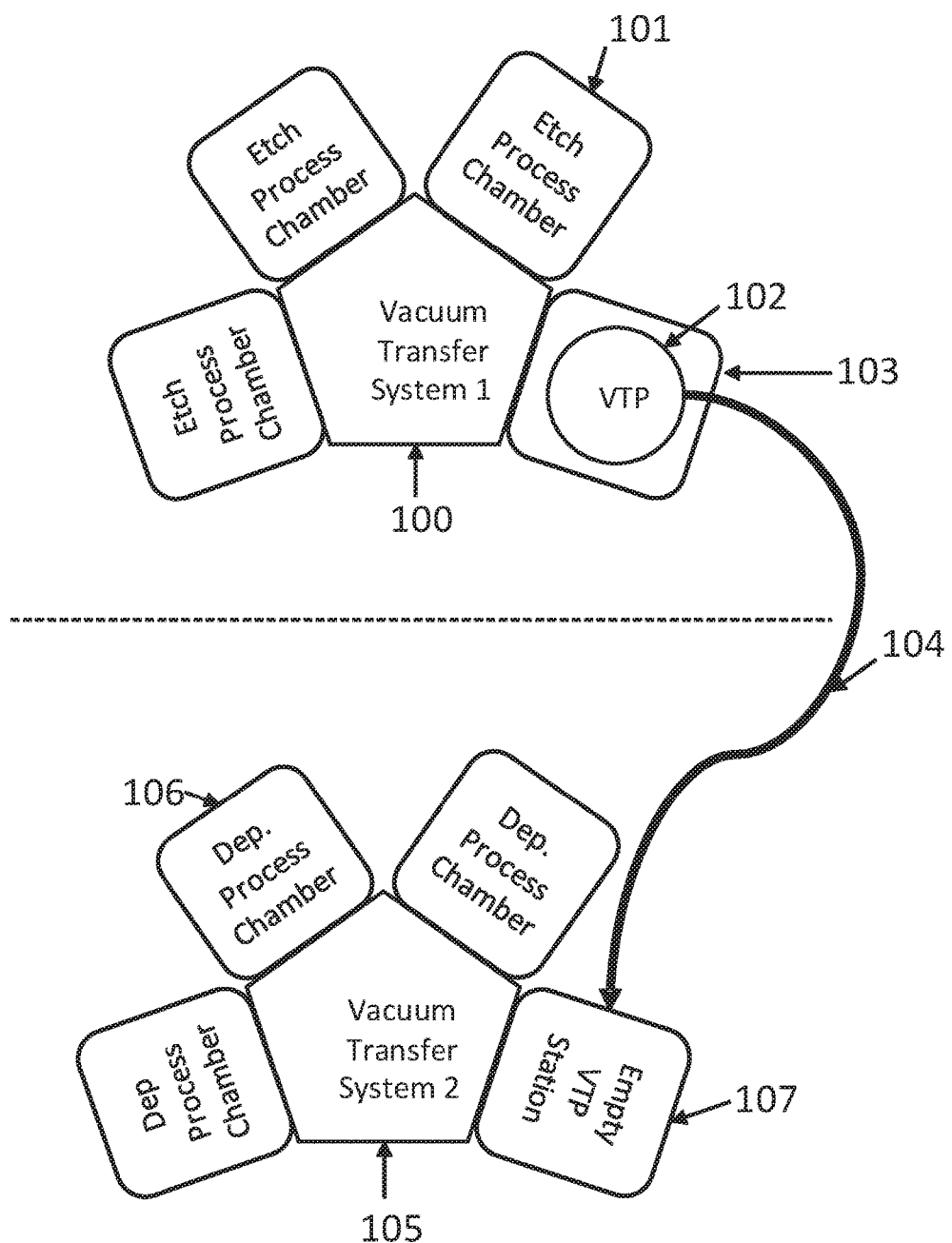
FIG. 1 is a schematic illustration of how a vacuum transport pod system is used to transfer wafers from a first vacuum system to second vacuum system.

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Integrated processing (processing wafers within a limited wait/idle time and under high vacuum conditions) has been recognized as an important requirement for successfully developing new device materials such as those used in MRAM and PCM. The exposure dose of unwanted gases such as moisture, oxygen, halogens, hydrocarbons, ammonia, carbon monoxide, carbon dioxide, amines, and other hydrocarbons can be detrimental to these new memory elements. In many cases, the damage can be defined as the product of exposure time multiplied by the partial pressure of said gases which wafers experience while staying idle between different steps of the integrated process scheme. Reducing the exposure to the contaminating environment is crucial for achieving high yields on novel memory devices and other sensitive materials. Currently, reducing the exposure time (minimize queue time between process steps) is provided by known methods to reduce exposure dosing. Another method is to combine the different process modules on one vacuum platform to transfer wafers at reduced pressure.

Novel memory devices such as, but not limited to, MRAM and PCM (PRAM, PCRAM, 3D XPoint) require process integration for etch, clean (wet and/or dry) and film deposition (PVD, ALD, PECVD). Some memory materials are very sensitive to moisture $O_2$, $H_2$, $NH_3$, and even $N_2$ exposure. Process sequence (etch, clean, deposition) requires wafers to be processed at a low pressure of intended process gases (few mTorr to Torr range) without exposing them to residual pressure of any other gases or ambient clean room environment (atmosphere) where high levels of moisture and $O_2$ are present.

Having all process modules integrated on one platform is a known method to address exposure effect for novel memory devices such as MRAM and PCM applications. An alternative method would be to move wafers under vacuum between different process modules/platforms without exposing sensitive materials to ambient clean-room atmosphere.

Vacuum transfer pod (VTP) systems can be used to transfer single or batches of wafers between different locations under vacuum (low gas pressure) conditions. One capability of a VTP system is to maintain the sensitive devices under a vacuum environment in the range from a few seconds to a few hours. Therefore, such a VTP system can eliminate the need of integrated (on the same platform) and/or fast (low queue time) processing between integration steps necessary to reduce exposure dosing, provided the exposure dose in the VTP system is low enough.

vPods manufactured by Brooks Automation Inc. are pumped down during transfer of wafers into them, and then sealed during their transport to the next process system. Thus, the pressure inside a vPod during transport depends on the leak rate and outgassing of internal surfaces, and the pressure can reach unacceptable levels increasing wafer exposure dose. Vacuum levels measured in vPods increase rapidly into the $10^{-4}$ Torr range or higher in a few seconds to a few minutes once active vacuum pumping is turned off. For many sensitive devices such as, MRAM or PCM, such a vacuum level could cause device failure in a very short time.

An embodiment of the present disclosure provides a VTP system with a passively capable vacuum pump with the capability of continuous vacuum pumping even while the VTP system is in transit from one system or location to another.

FIG. 1 is a schematic of how a VTP system 102 is used to transfer wafers from a first vacuum transfer system 100 to a second vacuum system 105. In this schematic, the first vacuum transfer system 100 includes three etch process chambers 101 and one VTP docking station 103, and the second vacuum system 105 includes three deposition process chambers 106 and one VTP docking station 107. In a typical MRAM or PCM process, wafer substrates are etched in process chambers 101, and transferred 104 under vacuum to a docked VTP system 102. The docked VTP system 102 with the etched wafer substrates is isolated, then undocked from docking station 103, and physically transferred and docked to empty docking station 107 on system 105. Once docked, the VTP system 102 is pumped out again allowing wafer substrates to be transferred under vacuum to the deposition process modules 106. In principle, the first and second vacuum transfer systems 100 and 105 could be physically separate and located a distance between each other. The distance can be small (e.g., a few meters adjacent to each other) or large (e.g., many meters away, or even many kilometers away). This transfer can occur between two or more systems and can happen one or more times in a complete wafer process cycle.

Figure 2:
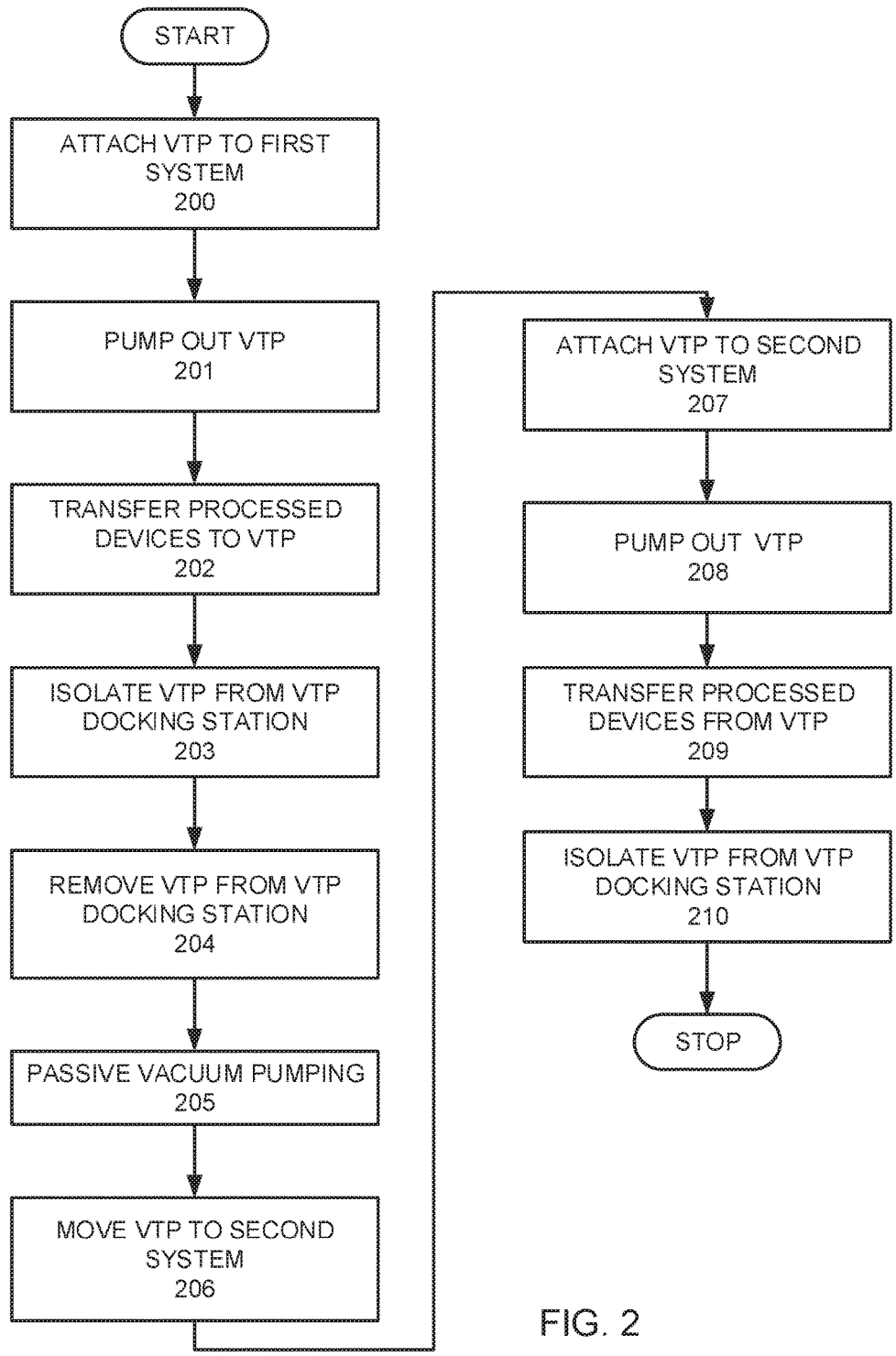
FIG. 2 is a flow chart of an example of using the above embodiment.
Figure 3:
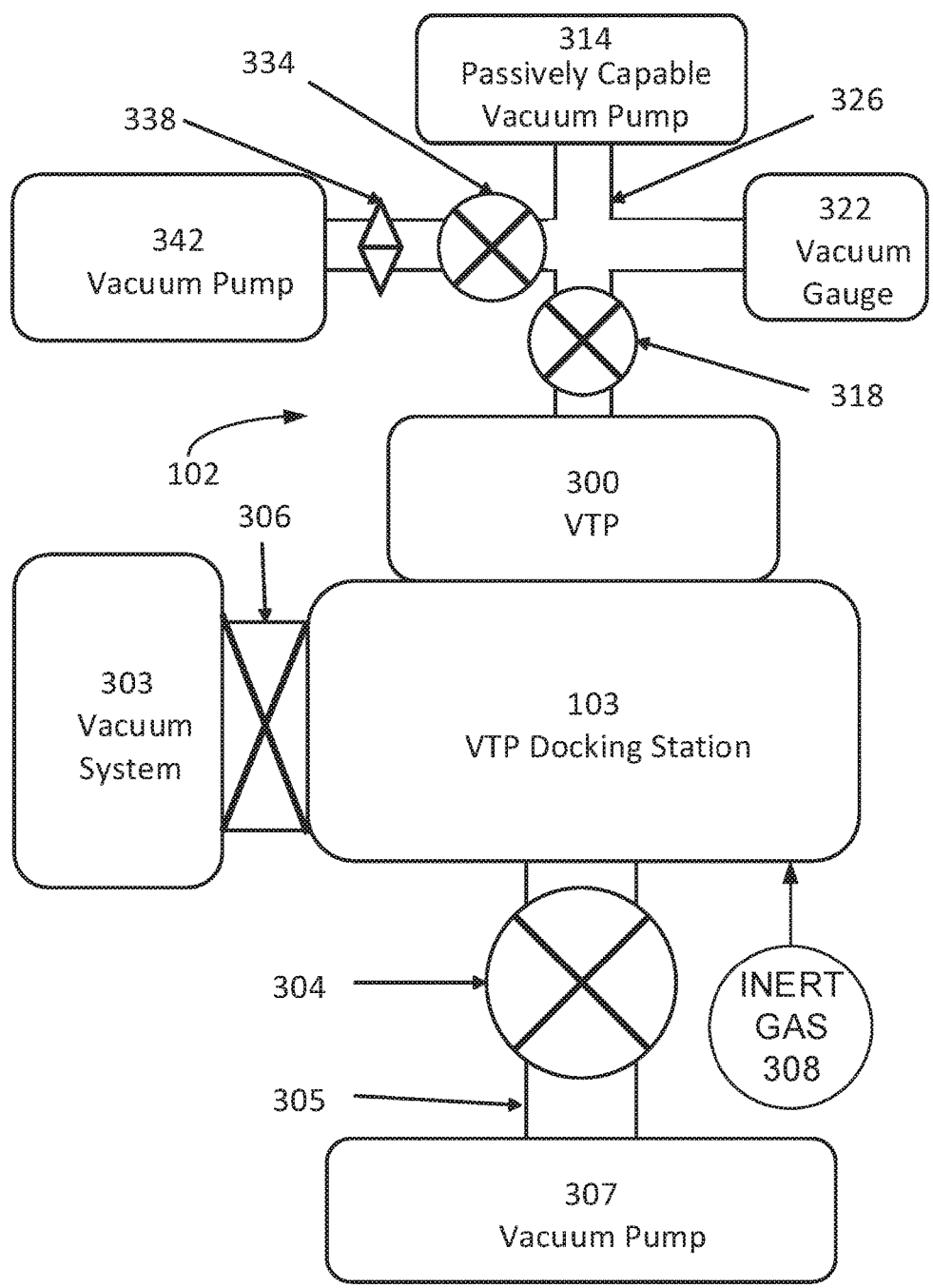
FIG. 3 is a schematic view of an embodiment of a vacuum transport pod system and docking station.

FIG. 2 represents a process flow to transfer wafer substrates between vacuum systems used in an embodiment. A VTP system 102 is docked to a first VTP docking station 103 (step 200). The VTP system 102 is pumped down to a transfer pressure by opening an isolation valve on the first VTP docking station 103 (step 201). Partially processed wafers are transferred into the VTP system 102 (step 202). When all the needed wafers are transferred, the isolation valve between the VTP system 102 and the first VTP docking station 103 is closed, and then at some time later the vacuum pumping line valve is closed (step 203). The VTP system 102 will initially have the same pressure as the pressure in the first vacuum transfer system 100. Prior to undocking, the VTP system 102 will be pumped to a lower pressure either through the vacuum pump located on the first VTP docking station 103, or a pump 342 connected directly to the VTP system 102 (FIG. 3). The VTP system 102 is undocked from the first VTP docking station 103 (step 204). A passively capable vacuum pump is used to maintain the pressure in the VTP system 102 by using passive vacuum pumping (step 205). The VTP system 102 is physically transferred from the first vacuum transfer system 100 to the second vacuum transfer system 105 (step 206) and docked to the second vacuum transfer system 105 (step 207). The vacuum pumping line is opened and the VTP system 102 pressure is equalized to the pressure of second vacuum transfer system 105, causing the VTP system 102 to be pumped out or back filled with an inert gas (step 208). The devices on wafers are transferred from the VTP system 102 into the second vacuum transfer system 105 (step 209). The VTP system 102 is isolated and then undocked from the second vacuum transfer system 105 (step 210).

FIG. 3 is a schematic view of an embodiment of the VTP system 102 and VTP docking station 103. The VTP system 102, comprises a VTP (vacuum transfer pod) 300, a passively capable vacuum pump 314, a main isolation valve 318, a high vacuum gauge 322, and pipes 326 of sufficient strength to mechanically connect and support the high vacuum gauge 322, and the passively capable vacuum pump 312 on the VTP 300. The VTP 300 is connected or docked to the VTP docking station 103. When docked, the VTP 300 is vacuum sealed through a gasket/O-ring, and vacuum valve 304 is opened allowing the vacuum pump 307 to pump down pressure in the VTP 300 through vacuum line 305. A gas injection line from an inert gas source 308 may be used to provide an air leak seal. The isolation valve 306 is opened allowing wafer substrates with processed devices to be transferred from the vacuum system 303 through the VTP docking station 103 into the VTP 300. The pressure in the VTP 300 and docking station 103 is equalized together with the pressure in the vacuum system 303 through the isolation valve 306.

Figure 4:
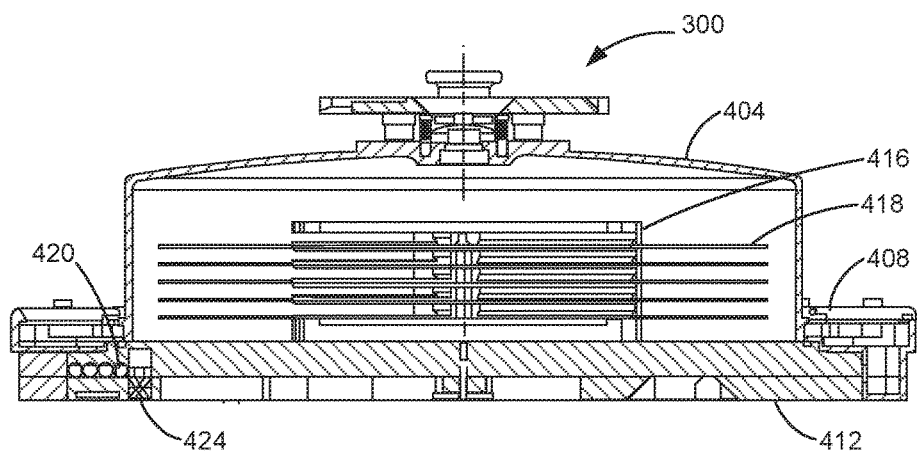
FIG. 4 is a cross-sectional view of a vacuum transport pod

FIG. 4 is a more detailed cross-sectional view of the VTP 300 used in an embodiment. The VTP 300 comprises a dome top 404 with a sealing flange 408, a door 412, and a wafer holder 416 for holding at least one wafer 418 with semiconductor devices. The dome top 404 and door 412 form an internal wafer storage chamber for storing one or more wafers. The wafer holder 416 provides a wafer support. In this embodiment, O-rings 420 are used to create a vacuum seal between the sealing flange 408 and the door 412. A plurality of door lock actuators 424 is used to mechanically hold the sealing flange 408 and door 412 together. In this embodiment, the dome top 404 and the door 412 are aluminum or an aluminum alloy, in order to provide a lighter VTP 300.

Figure 5:
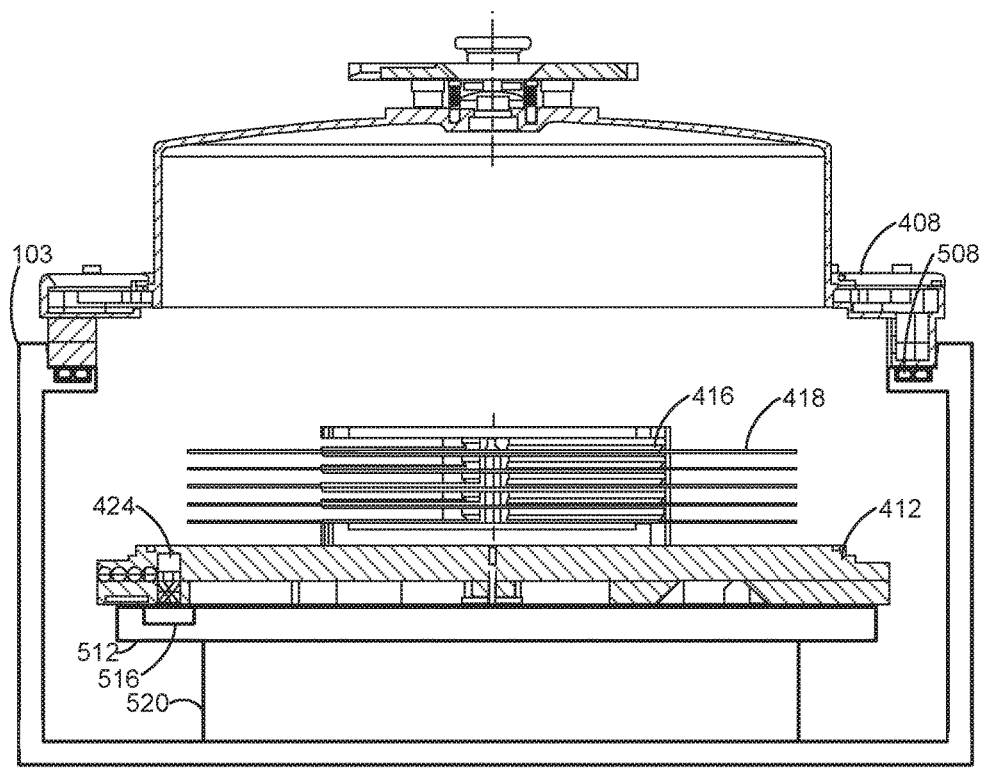
FIG. 5 is a schematic cross-sectional view of the vacuum transport pod mounted in a docking station.

FIG. 5 is a schematic cross-sectional view of the VTP 300 mounted in the VTP docking station 103. The sealing flange 408 is mounted on an upper part of the VTP docking station 103. An air leak seal is created between the sealing flange 408 and the VTP docking station 103. O-rings 508 are used to provide the air leak seal between the sealing flange 408 and the VTP docking station 103. The part of the sealing flange 408 in contact with the O-rings 508 is adapted to help create the air leak seal. In another example, an inert gas source 308, such as a nitrogen gas source, provides a flow of an inert gas that is also used to provide the air leak seal. A wafer 418 is transferred from the first device a vacuum system into the wafer holder 416 of the VTP 300. The door 412 is supported on a platform 512. A release device 516 is used to release the door lock actuators 424. An actuator 520 lowers the platform 512, which lowers the door 412, and the wafer holder 416 into the VTP docking station 103, as shown. A robotic device may be used to move wafers into or out of the wafer holder 416.

Referring back to FIG. 3, in this embodiment, the passively capable vacuum pump 314 is a getter pump, a titanium sublimation pump, or a sorption pump. An optional vacuum isolation valve 334 and a quick release connector 338 allows for an optional temporary attachment of an optional high vacuum pump 342.

One property of the sublimation or sorption pump is that it can continue gas pumping for a time even after power is turned off or removed, providing the passively capable vacuum pumping. In this type of pump, gas is consumed by a reaction with an activated surface. In a typical operation sequence, the sublimation or sorption pump (i.e., passively capable vacuum pump 314) is activated by closing the main isolation valve 318, turning on the optional high vacuum pump 342, opening the optional vacuum isolation valve 334 and applying heat or power to the passively capable vacuum pump 314 for a sufficient time to generate the activated surface. While a power source is available, active pumping may be used to maintain the pressure in the VTP 300. The active pumping may be provided by the optional high vacuum pump 342 or by the passively capable vacuum pump 314, which is able to actively pump when power is available. To enact a VTP transfer, the main isolation valve 318 is opened if not already opened. Then power is removed from the passively capable vacuum pump 314, and the optional vacuum isolation valve 334 is closed. Then the optional high vacuum pump 342 is disconnected from the VTP system 102 by the quick release connector 338. In this condition, the VTP system 102 can be maintained for some time at an ultra-high vacuum conditions at a pressure of less than $10^{-3}$ Torr by the passive pumping of the passively capable vacuum pump 314. Depending on the gas leak-back rate of the VTP 300 and the size of the passively capable vacuum pump 314, ultra-high vacuum conditions can be maintained for hours or even days.

This embodiment allows the storage of wafers for an extended period of time (e.g., up to several days) without a power supply. In this embodiment, since the VTP 300 is made of aluminum containing parts, the aluminum containing parts out-gas at pressures above 1 mTorr. Without the passively capable vacuum pump 314, the out gassing would normally increase the chamber pressure within the VTP 300 to a pressure above 1 mTorr, once the VTP 300 is removed from active vacuum pumping. However, the passively capable vacuum pump 314 is able to keep the chamber pressure below 1 mTorr without using any power. This passive pumping is able to extend the time that the chamber pressure is below 1 mTorr, while using zero or a minimal amount of power. In order for the passively capable vacuum pump 314 to provide passive pumping to maintain a chamber pressure of less than 1 mTorr, the passage or connection from the VTP 300 to the passively capable vacuum pump 314 should be sized appropriately to overcome the natural out-gassing of the chamber materials, as well as any leaks through the sealing surfaces. Preferably, the cross-section of the opening providing a fluid connection between the passively capable vacuum pump and the chamber would be greater than 2 $cm^2$. In other embodiments, other kinds of pumps may be used to provide an ultra-high vacuum below 1 mTorr using a power source. Mechanically supporting the various components on the VTP 300 and providing an optional quick release connector 338 makes the VTP system 102 more portable.

Providing storage of wafers in high or ultra-high vacuum allows for the storage of wafers with memory devices for a period of several days, without degradation of the memory devices. Exposure to moisture, oxygen, halogens, hydrocarbons, ammonia, carbon monoxide, carbon dioxide, amines, and other hydrocarbons for a period of time could damage such devices. However, the high vacuum prevents or reduces such damage.

In a test of an embodiment, a turbo pump was used as the high vacuum pump 342 to provide an initial pressure of $8.9 \times 10^{-7}$ Torr. The passively capable vacuum pump 314 was a sublimation/getter pump. Using active gettering, after more than 55 hours, the pressure within the VTP 300 remained at $10^{-4}$ Torr. Active gettering is a process that provides energy, such as heat to the passively capable vacuum pump 314 to enhance the gettering process. In another test with an initial pressure of $10^{-4}$ Torr, after more than 63 hours of passive gettering the pressure was $2.1 \times 10^{-4}$ Torr. Passive gettering, is a gettering process that does not require the addition of heat or any other energy. In a controlled example, without a gettering pump or a turbo pump, the pressure was pumped down to $4.9 \times 10^{-2}$ Torr using a vacuum pump that is not an ultra-high vacuum pump. After about 46 hours, the final pressure was 3.8 Torr. These tests show that the VTP 300 may use a gettering pump without power and maintain an ultra-high vacuum with a pressure below 1 mTorr for over 63 hours. By not requiring power, the VTP 300 is easier to transport by truck, train, or airplane.

In other embodiments, other ultra-high vacuum pumps such as a cryogenic pump or other vacuum pump may be used in place of a turbo pump as the high vacuum pump 342. In other embodiments, other pumps such as a molecular sorption pump or other surface activated pumps may be used as the passively capable vacuum pump 314. An additional vacuum pump may be used in addition to the high vacuum pump 342 in various embodiments. An ion gauge may be used for the high vacuum gauge 322. In other embodiments, other devices may be used for the high vacuum gauge 322.

In other embodiments, a manual pod opener may be used to manually load wafers to and from the VTP 300. Such embodiments would expose the wafers to the ambient atmosphere for a short time. In various embodiments, the wafer holder 416 may be provided by shelves which hold outer edges of the wafers. Some embodiments may provide a VTP 300 that holds a single wafer. Various embodiments may place a shut off valve, such as isolation valve 318, at different locations, as long as a shut off valve is able to isolate the passively capable vacuum pump 314 from the VTP 300. In other methods, the passively capable vacuum pump 314 may use active pumping during transportation.

While this disclosure has been described in terms of several preferred embodiments, there are alterations, permutations, modifications and various substitute equivalents, which fall within the scope of this disclosure. It should also be noted that there are many alternative ways of implementing the methods and apparatuses of the present disclosure. It is therefore intended that the following appended claims be interpreted as including all such alterations, permutations, modifications, and various substitute equivalents as fall within the true spirit and scope of the present disclosure.

What is claimed is:

1. An apparatus for transporting or storing at least one semiconductor wafer in a vacuum, comprising:
    a portable vacuum transfer pod, comprising:
        an internal wafer storage chamber for storing one or more wafers; and
        a wafer support for supporting at least one wafer within the internal wafer storage chamber;
    a passively capable vacuum pump capable of passive vacuum pumping in fluid connection with the internal wafer storage chamber, and mechanically connected to the portable vacuum transfer pod; and
    a shut off valve for opening and closing the fluid connection between the passively capable vacuum pump and the internal wafer storage chamber.

2. The apparatus recited in claim 1, wherein the portable vacuum transfer pod further comprises at least one sealing element for creating a vacuum seal with a vacuum transfer pod docking station.

3. The apparatus of claim 1, wherein the passively capable vacuum pump comprises at least one of a titanium sublimation pump, a getter pump, or a sorption pump.

4. The apparatus recited in claim 1, further comprising an inert gas source for preventing air from leaking into the internal wafer storage chamber.

5. The apparatus recited in claim 1, further comprising:
   a quick release connector in fluid connection with the portable vacuum transfer pod; and
   a high vacuum pump mechanically connected to the quick release connector.

6. The apparatus recited in claim 5, wherein the high vacuum pump is a turbo pump or a cryogenic pump.

7. The apparatus recited in claim 1, wherein the fluid connection between the passively capable vacuum pump and the internal wafer storage chamber has a cross-sectional area of at least 2 cm$^2$.

8. The apparatus recited in claim 1, wherein the internal wafer storage chamber comprises aluminum containing parts.

9. The apparatus recited in claim 1, further comprising a high vacuum gauge in fluid connection with the internal wafer storage chamber and mechanically connected to the portable vacuum transfer pod.

10. The apparatus recited in claim 9, wherein the high vacuum gauge is an ion gauge.

11. The apparatus recited in claim 1, wherein the portable vacuum transfer pod further comprises a door adapted to provide passage of at least one semiconductor wafer into or out of the internal wafer storage chamber and to seal the portable vacuum transfer pod.

12. A method for transporting a wafer from a first wafer processing device to a second wafer processing device, comprising:
   docking a portable vacuum transfer pod to a first docking station;
   pumping down pressure in the portable vacuum transfer pod;
   transferring at least one wafer through the first docking station to the portable vacuum transfer pod;
   sealing the portable vacuum transfer pod and removing the portable vacuum transfer pod from the first docking station;
   using a passively capable vacuum pump to passively maintain pressure in the portable vacuum transfer pod at a pressure less than $1 \times 10^{-3}$ Torr;
   moving the portable vacuum transfer pod to a second docking station;
   docking the portable vacuum transfer pod to the second docking station; and
   transferring the at least one wafer from the portable vacuum transfer pod through the second docking station.

13. The method of claim 12, wherein the passively capable vacuum pump is at least one of a titanium sublimation pump, a getter pump, or a sorption pump.

14. The method of claim 13, wherein the using the passively capable vacuum pump, comprises:
   closing a shut off valve between the passively capable pump and the portable vacuum transport pod;
   activating the passively capable vacuum pump;
   opening the shut off valve;
   actively pumping;
   stopping the actively pumping; and
   passively pumping.

15. The method of claim 12, further comprising:
   mechanically connecting a high vacuum pump to the portable vacuum transfer pod through a quick release connector, which is in fluid connection with the portable vacuum transfer pod;
   using the high vacuum pump to pump down the portable vacuum transfer pod; and
   disconnecting the high vacuum pump through the quick release connector.

16. The method of claim 12, further comprising creating an air leak seal between the portable vacuum transport pod and the second docking station.

17. The method of claim 12, wherein the using the passively capable pump to passively maintain pressure provides passive pumping without the use of external power for at least one day.

* * * * *